(12) United States Patent
Sandhu et al.

(10) Patent No.: US 7,529,307 B2
(45) Date of Patent: May 5, 2009

(54) INTERLEAVER

(75) Inventors: Sumeet Sandhu, San Jose, CA (US); David Cheung, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 755 days.

(21) Appl. No.: 11/093,743

(22) Filed: Mar. 30, 2005

(65) Prior Publication Data

US 2006/0242475 A1    Oct. 26, 2006

(51) Int. Cl.
*H04K 1/10* (2006.01)
*H04L 27/28* (2006.01)

(52) U.S. Cl. .................. 375/260; 375/268; 375/285

(58) Field of Classification Search .............. 375/260, 375/229, 240, 248, 285; 370/468, 328
See application file for complete search history.

(56) References Cited

U.S. PATENT DOCUMENTS

| | | | |
|---|---|---|---|
| 6,345,377 B1 * | 2/2002 | Kroeger et al. | 714/790 |
| 6,690,736 B1 * | 2/2004 | Andre | 375/260 |
| 7,145,956 B2 | 12/2006 | Koifman | |
| 2001/0031016 A1 | 10/2001 | Seagraves | |
| 2003/0063685 A1 * | 4/2003 | Yoshida | 375/295 |
| 2004/0017860 A1 | 1/2004 | Liu | |
| 2004/0184398 A1 | 9/2004 | Walton et al. | |
| 2004/0202257 A1 | 10/2004 | Mehta et al. | |
| 2005/0157639 A1 * | 7/2005 | Song et al. | 370/208 |
| 2005/0159115 A1 | 7/2005 | Sandhu | |
| 2006/0013181 A1 | 1/2006 | Stolpman et al. | |
| 2006/0034390 A1 | 2/2006 | Vummintala et al. | |
| 2006/0067411 A1 | 3/2006 | Sandhu | |
| 2006/0088115 A1 | 4/2006 | Chen et al. | |
| 2006/0104377 A1 | 5/2006 | Chimitt et al. | |
| 2006/0156087 A1 | 7/2006 | Lin et al. | |
| 2006/0203779 A1 * | 9/2006 | Attar et al. | 370/335 |

(Continued)

FOREIGN PATENT DOCUMENTS

WO    WO-2006/071376 A2    7/2006

(Continued)

OTHER PUBLICATIONS

"U.S. Appl. No. 10/990,026, Non-Final Office Action mailed Mar. 18, 2008", 18 pgs.

(Continued)

*Primary Examiner*—Chieh M Fan
*Assistant Examiner*—Qutbuddin Ghulamali
(74) *Attorney, Agent, or Firm*—Schwegman, Lundberg & Woessner, P.A.; Gregory J. Gorrie

(57) ABSTRACT

An interleaver and scheme for interleaving in which highly correlated bits are maximally separated. The scheme involves interleaving a set of bits to be delivered to a modulation system that utilizes a quantity of N carrier frequencies. A first block of N consecutive bits is assigned to each of N bins, on a one-bit-per-one-bin basis. The aforementioned assignment proceeds in a particular sequence. A second block of N consecutive bits is assigned to each of the N bins, on a one-bit-per-one-bin basis. The second block is assigned in the same sequence the first block was assigned. The second block is consecutive to the first block.

8 Claims, 6 Drawing Sheets

U.S. PATENT DOCUMENTS

2006/0274687 A1* 12/2006 Kim .................. 370/328
2007/0025317 A1 2/2007 Bolinth et al.
2007/0211810 A1 9/2007 Bohnke et al.

FOREIGN PATENT DOCUMENTS

WO WO-2006/076193 A1 7/2006

OTHER PUBLICATIONS

"U.S. Appl. No. 11/034,204 Response filed Mar. 25, 2008 to Non-Final Office Action mailed Feb. 13, 2008", 17 pgs.

"U.S. Appl. No. 11/034,204, Non-Final Office Action mailed Feb. 13, 2008", 13 pgs.

"U.S. Appl. No. 11/034,204 Final Office Action mailed Jul. 24, 2008", 13 pgs.

"International Preliminary Report on Patentability for corresponding PCT Application No. PCT/US2005/041200 mailed May 31, 2007", 9 pgs.

"U.S. Appl. No. 10/990,026 Response filed Jun. 2, 2008 to Non-Final Office Action mailed Mar. 18, 2008", 13 pgs.

Bauch, G., et al., "Parameter Optimization, Interleaving and Multiple Access in OFDM with Cyclic Delay Diversity", *IEEE Vehicular Technology Conference*, vol. 1, (2004), 505-509.

Hou, C., et al., "A Novel Method with Adaptive Multi-Service Transmission Algorithms Based on OFDM", *Proceedings of the 2002 IEEE Canadian Conference on Electrical & Computer Engineering*, 1, (May 12, 2002), 1305-1310.

Salvekar, A., et al., "Multiple-Antenna Technology in WiMAX Systems", *Intel Technology Journal*, 8(3), (Aug. 20, 2004), 229-240.

Song, K., et al., "A Low Complexity Space-Frequency BICM MIMO-OFDM System for Next-Generation WLANs", *IEEE Global Telecommunications Conference (GLOBECOM '03)*, vol. 2, (Dec. 1, 2003), 1059-1063.

Stauffer, E., et al., "Space-Frequency Bit-Interleaved Coded Modulation for MIMO-OFDM", *Conference Record of the Thirty-Ninth Asilomar Conference on Signals, Systems and Computers*, (Oct. 28, 2005), 1248-1252.

Wong, C. Y., et al., "Multiuser Subcarrier Allocation for OFDM Transmission using Adaptive Modulation", *IEEE Vehicular Technology Conference*, vol. 1, (May 16, 1993), 479-483.

* cited by examiner

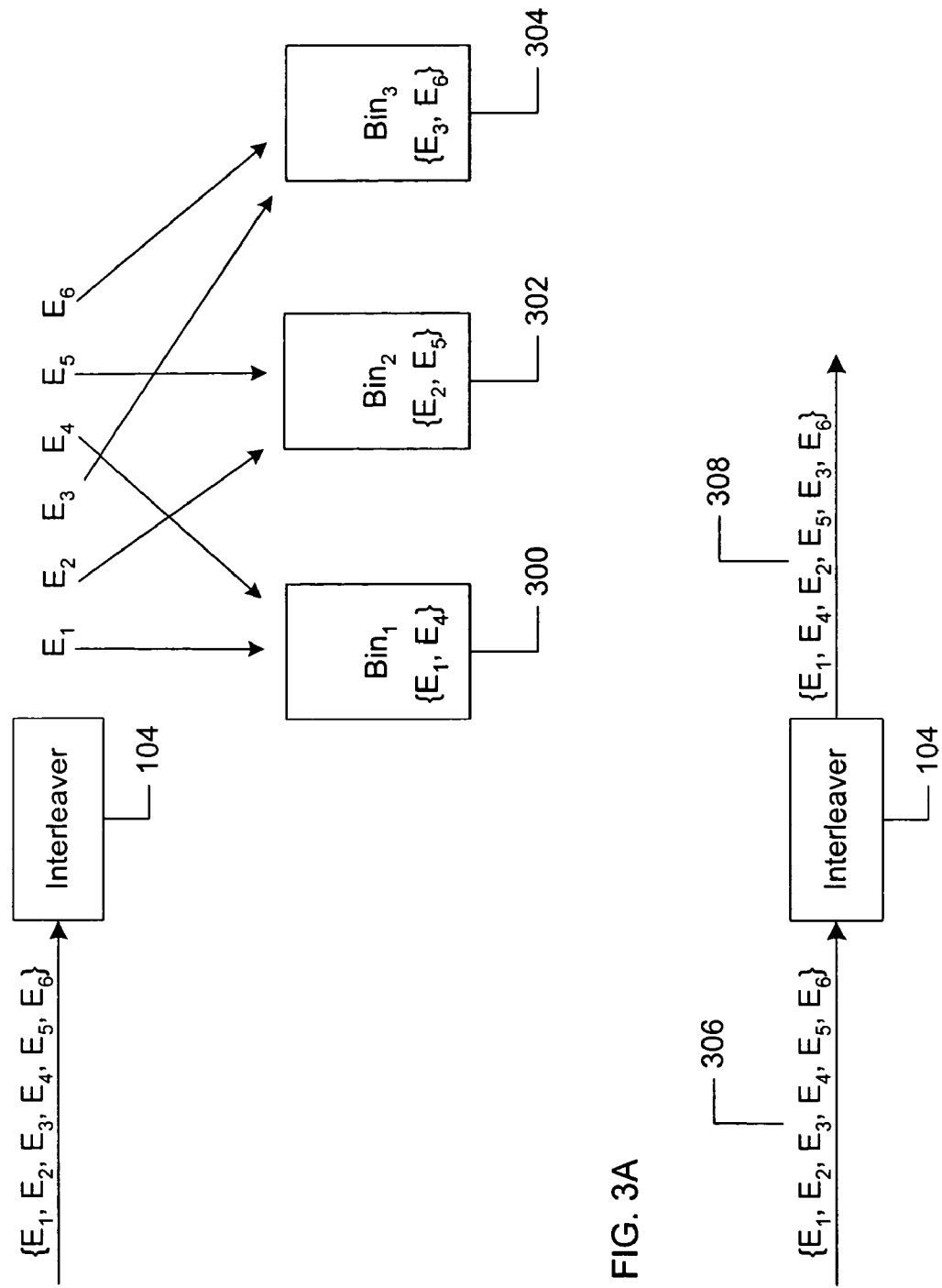

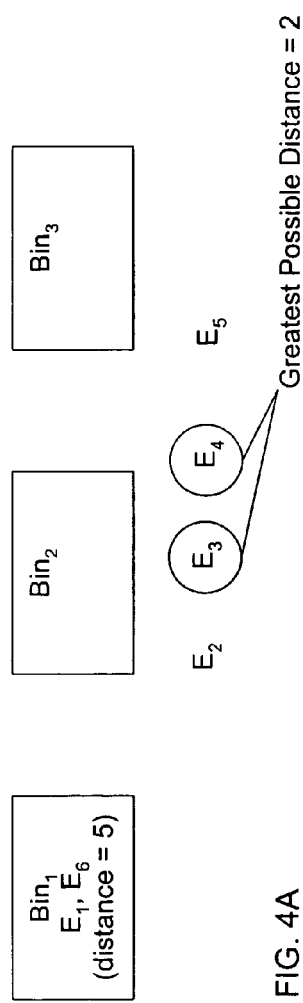
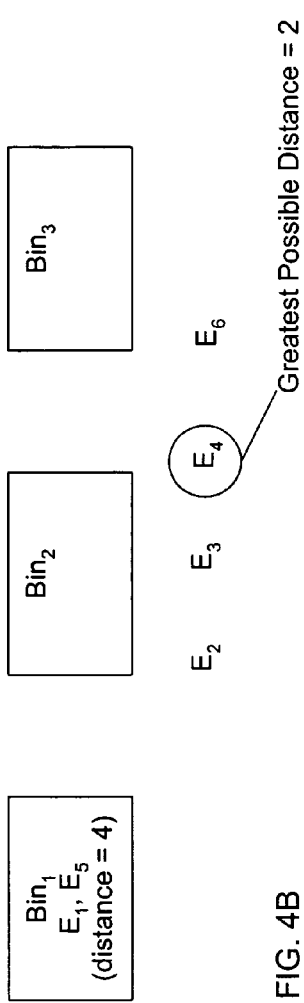
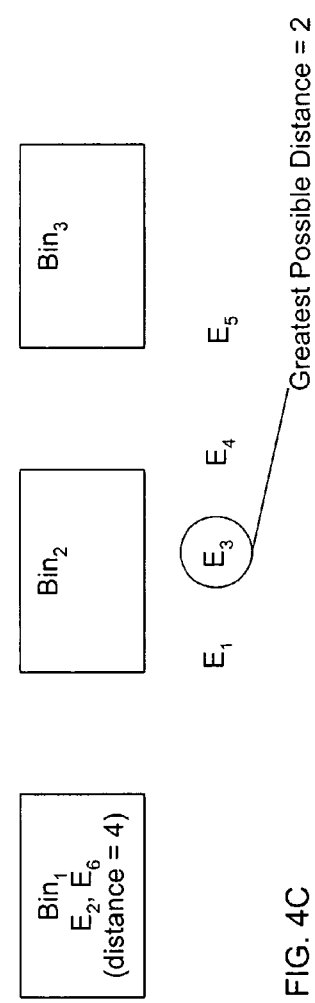
FIG. 4A
FIG. 4B
FIG. 4C

INTERLEAVER

TECHNICAL FIELD

Embodiments of the present invention relate to wireless and wired digital communication devices, and more particularly to interleavers and schemes for interleaving employed in such devices.

BACKGROUND

It is commonplace for digital communication devices to employ an architecture including an encoder, an interleaver and a modulator. The encoder receives data bits, convolves the data bits, and outputs encoded bits. The encoded bits are received by an interleaver, which re-sequences the encoded bits, and delivers the re-sequenced bits to a modulation system. The modulation system translates the encoded bits into symbols that are modulated upon one or more carrier frequencies for transmission to one or more receiving devices.

The ratio between the number of received data bits and the number of encoded bits generated by the encoder is termed the code rate, k/n. The number of stages of memory employed by an encoder is termed the constraint length, K. Any set of nK consecutive bits yielded by an encoder are correlated. For the sake of "spreading out" the impact of noise and interference during transmission, it is important not to carry correlated bits on the same transmission symbol. Therefore, if a transmission symbol is determined by a quantity of B bits, none of the B bits determining the symbol should be correlated. An interleaver may re-sequence the bits prior to their delivery to a modulation system, to ensure that such a condition is satisfied.

From the foregoing, it is evident that the level of required separation of encoded bits is proportional to the constraint length, K, of the encoder. As communication systems employ encoders exhibiting ever-greater constraint lengths, it is important to ensure that the ability to separate bits determining a transmission symbol is improved.

For the foregoing reason, it is desirable to employ an interleaving scheme that ensures that encoded bits are greatly and uniformly separated.

BRIEF DESCRIPTION OF THE DRAWINGS

FIG. 3A depicts a scheme by which encoded bits may be interleaved.

FIG. 3B depicts another scheme by which encoded bits may be interleaved.

FIGS. 4A-4C depict various attempts to create pairings between encoded bits.

DETAILED DESCRIPTION

Figure 1:
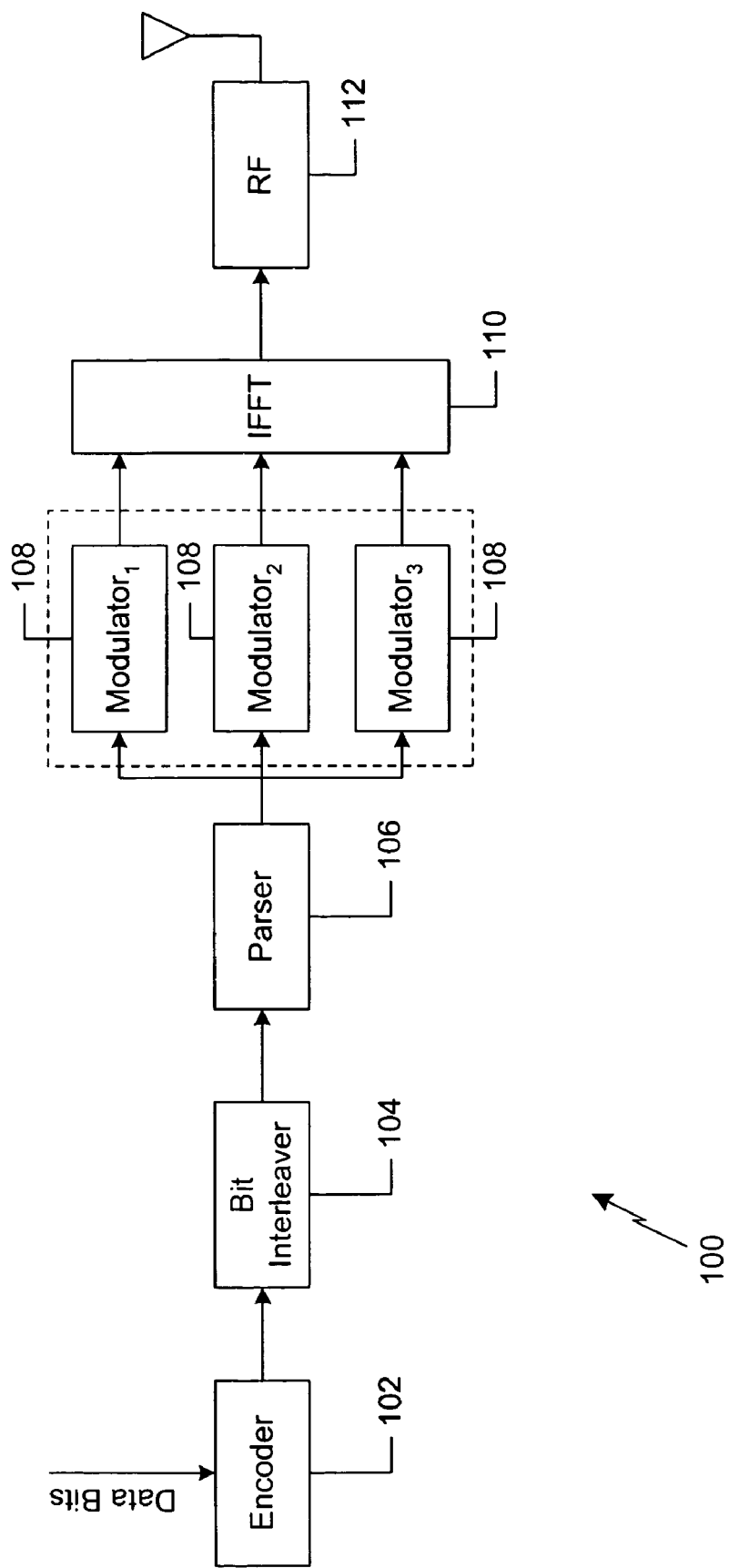
FIG. 1 depicts a transmitter, in accordance with one embodiment of the invention.

FIG. 1 depicts a transmitter 100. The transmitter 100 includes an encoder 102, which receives data bits, and yields encoded bits therefrom. The encoded bits are received by an interleaver 104 that may operate in accordance with the scheme presented herein with reference to FIGS. 2-6. The interleaver 104 communicates the re-sequenced encoded bits to a parser 106. The parser 106 groups the re-sequenced bits into units for representation as a symbol. For example, the transmitter 100 may use a modulation technique such as quadrature phase shift keying (QPSK), in which case the parser 106 groups the re-sequenced bits into units of two bits apiece, because in QPSK each transmission symbol is determined by two bits. On the other hand, the transmitter may utilize 16-QAM (quadrature amplitude modulation), in which case the parser 106 groups the re-sequenced bits into units of four bits apiece, because in 16-QAM each symbol is determined by four bits. In principle, the transmitter 100 may employ any modulation technique, meaning that a symbol produced by the transmitter 100 may be determined by any number of bits, and that the parser 106 may agglomerate the re-sequenced bits into units of any size. The parser 106 may be realized as a part of the interleaver 104, or may be realized as a separate device or circuit. The parser 106 is depicted herein as a separate from the interleaver 104 for the sake of example only.

The parser 106 communicates the grouped bits to one of multiple modulators 108. Although FIG. 1 depicts the transmitter 100 as including three modulators 108, the transmitter 100 may include two or more modulators 108, in principle. Each modulator 108 receives a set of bits from the parser 106, and based thereupon, selects a symbol to represent the set of bits, and modulates the selected symbol upon a carrier frequency. Each modulator 108 may be assigned a different carrier frequency. For example, transmitter 100 may operate according to IEEE 802.11a, meaning that communication between the transmitter 100 and a receiver (not depicted) occurs via 48 separate sub-carrier frequencies simultaneously. Thus, transmitter 100 may include 48 separate modulators 108—one for each sub-carrier frequency. For the sake of illustration only, the example discussed with reference to FIGS. 1-5 employs a modulation system using only three carrier frequencies, and an encoder exhibiting a code rate of k/n=½ and having a constraint length of K=3. A practical system may employ a modulation system using many more carrier frequencies, and may employ an encoder exhibiting a code rate of less or greater than ½, and/or exhibiting a constraint length K greater than or less than 3.

Communication between the parser 106 and the modulators 108 may be parallel or serial. The modulators 108 may yield an analog output or a digital output. The particular transmitter 100 depicted in FIG. 1 employs modulators 108 that yield digital outputs. Specifically, the modulators 108 depicted in FIG. 1 generate a set of Fourier coefficients as an output. The modulators 108 may, as a group, be referred to as a modulation unit.

The Fourier coefficients are communicated to an inverse transformation unit 110. The inverse transformation unit 110 may employ an inverse transformation to the coefficients received from the modulators 108. For example, the inverse transformation unit 110 may employ an inverse fast Fourier transformation. The output of the inverse transformation unit 110 is one or more time-based sequences, which are communicated to radio frequency (RF) circuitry 112. The RF circuitry 112 generates one or more analog signals corresponding to the one or more time-based sequences, and delivers the one or more analog signals to one or more antennas for transmission. The antennas may comprise one or more directional or omnidirectional antennas, including, for example, dipole antennas, monopole antennas, patch antennas, microstrip antennas or other types of antennas suitable for reception and/or transmission of RF signals.

It should be noted that the encoder 102, interleaver 104, parser 106, modulator 108, and inverse transfer unit 110 may be embodied as a digital chip, such as a digital application specific integrated circuit (ASIC), and the RF circuitry may be embodied as an analog chip. Optionally, the digital ASIC and analog ASIC may be embodied on the same chip (i.e., may be embodied in a mixed mode chip). Of course, the encoder 102, interleaver 104, parser 106, modulator 108, and inverse transfer unit 110 may be embodied on separate digital chips, or may be grouped together, as desirable given other design factors.

The various units of the transmitter 100 may be said to operate in cycles, with each cycle representing a period of time during which a symbol is modulated upon a given carrier frequency. During a first cycle, a first symbol is modulated upon a given carrier frequency. During a second cycle, a second symbol is modulated upon the given carrier frequency, and so on. Thus, assuming a system in which two bits determine a symbol, and in which three carrier frequencies are employed, six encoded bits propagate through the transmitter system 100 in a cycle. Such a system is depicted in FIG. 2.

Figure 2:
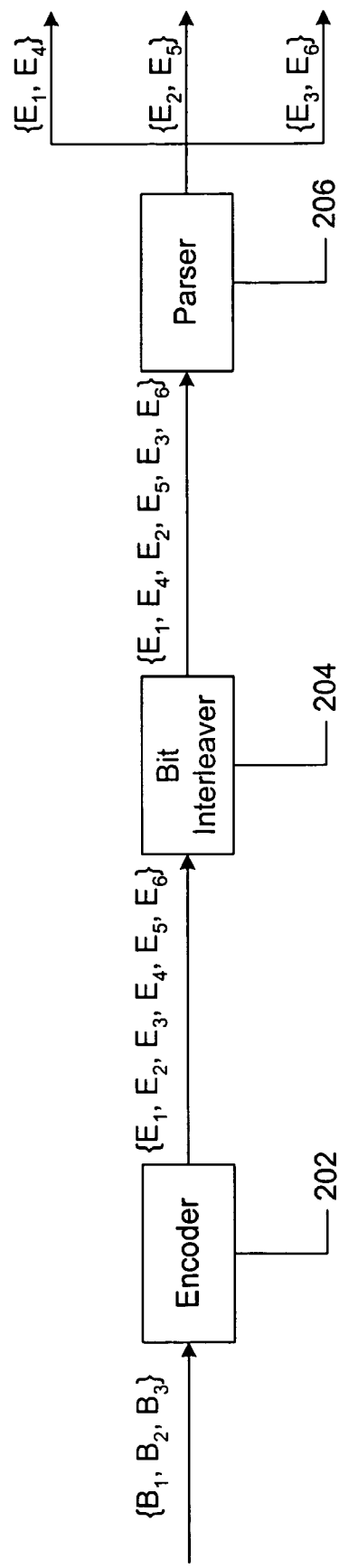
FIG. 2 depicts data flow through a transmitter in a single cycle.

Turning to FIG. 2, therein is depicted data flow through the transmitter 100 (FIG. 1) in a single cycle. As can be seen, a cycle begins with the encoder 102 receiving data bits $B_1$, $B_2$, and $B_3$. In a given cycle, the encoder 102 receives a quantity of data bits $B_1$, $B_2$, and $B_3$ equal to the product of the code rate, the number of bits per symbol, and the number of carrier frequencies employed by the transmitter. In the particular example of FIG. 2, the code rate is equal to ½, the number of bits per symbol is equal to 2, and the number of carrier frequencies is equal to 3. Therefore, three data bits $B_1$, $B_2$, and $B_3$ are received by the encoder in a given cycle (½*2*3=3 bits per cycle).

In response to receiving three data bits $B_1$, $B_2$, and $B_3$, the encoder 102 yields six encoded bits $E_1$-$E_6$. The number of encoded bits received by the interleaver 104 in a given cycle is equal to the product of the number of carrier frequencies employed by the transmitter 100 and the number of bits per symbol required by the chosen modulation technique. Thus, in the example of FIG. 2, six encoded bits are received by the interleaver 104. The six encoded bits $E_1$-$E_6$ are resequenced by the interleaver 104, and passed to the parser 106. The parser 106 supplies each modulator (not depicted in FIG. 2) with a sufficient number of encoded bits $E_1$-$E_6$ to determine a symbol—in this example, two encoded bits per symbol.

FIG. 3A depicts one scheme by which the interleaver 104 may re-sequence the bits. As shown in FIG. 3A, the interleaver may have access to several bins 300-304. The bins 300-304 may be embodied as a memory space. For example, each of the bins 300-304 may be embodied as an array in a memory device, or may be embodied as one or more registers. The bins 300-304 may be included as part of the interleaver 104, or may be embodied as memory spaces separate and apart from the interleaver 104. There is one bin 300-304 for each carrier frequency employed by the transmitter. Each bin 300-304 corresponds to one of the modulators 108 (FIG. 1). Further, each bin 300-304 is dimensioned to store a quantity of bits greater than or equal to the number of bits per symbol required by the chosen modulation scheme.

Given the present example, each bin 300-304 is dimensioned to store at least two bits (because in the chosen exemplary modulation scheme, two bits determine a symbol). $Bin_1$ 300 corresponds to the first modulator ($modulator_1$, shown in FIG. 1), $bin_2$ 302 corresponds to the second modulator ($modulator_2$, shown in FIG. 1), and $bin_3$ 304 corresponds to the third modulator ($modulator_3$, shown in FIG. 1). With each cycle of transmitter operation, the bits stored in each bin 300-304 are communicated to their respective modulators 108. Thus, assuming encoded bits $E_1$ and $E_4$ are stored in $bin_1$ 300, those bits are communicated to modulators 108 during the subsequent cycle of operation, meaning that a symbol determined by those two bits is modulated upon the carrier frequency employed by the first modulator 108.

During operation, the interleaver 104 may receive a set of encoded bits. The length of the set is equal to the product of the number of carrier frequencies employed by the transmitter 100 and the number of bits per symbol required by the chosen modulation technique.

Each bit within the set of bits received by the interleaver 104 may be understood as having a position within the set. For example, encoded bit $E_1$ may be said to occupy the first position, because it is the first bit received by the interleaver during the present operation cycle. Similarly, encoded bit $E_2$ may be said to occupy the second position within the set, because it is the second bit received by the interleaver during the present operation cycle. Additionally, each bit within the set may be understood as having an index representing the particular bit's position within the set. Thus, encoded bit $E_1$ has an index of "1" (because it occupies the first position in the set), encoded bit $E_2$ has an index of "2" (because it occupies the second position in the set), and so on.

Given the present example, in which the transmitter 100 employs three carrier frequencies and uses a modulation technique in which two bits determine a symbol, the interleaver 104 depicted in FIG. 3A receives six encoded bits $E_1$-$E_6$. The interleaver 104 re-sequences the bits $E_1$-$E_6$ by assigning each bit to the bins 300-304 on a round-robin basis. The first encoded bit $E_1$ is assigned to $bin_1$ 300; the second encoded bit $E_2$, $bin_2$ 302; the third encoded bit $E_3$, $bin_3$ 304. After having assigned one encoded bit to each of the bins 300-304, the process is repeated identically upon the next contiguous set of three bits. Thus, the fourth encoded bit $E_4$ is assigned to $bin_1$ 300; the fifth encoded bit $E_5$, $bin_2$ 302; the sixth encoded bit $E_6$, $bin_3$ 304.

Upon completion of the assignment process certain characteristics are exhibited. Encoded bits $E_1$ and $E_4$ (in $bin_1$) are assigned to $modulator_1$. Notably, the indices of both bits $E_1$ and $E_4$ assigned to $bin_1$, when divided by the number of bins, exhibit the same remainder (example: 1 mod 3=1; and 4 mod 3=1). Similarly, the indices of both bits $E_2$ and $E_5$ assigned to $bin_2$, when divided by the number of bins exhibit the same remainder (example: 2 mod 3=2; and 5 mod 3=2). Finally, the indices of both bits $E_3$ and $E_6$ assigned to $bin_3$, when divided by the number of bins exhibit the same remainder (example: 3 mod 3=0; and 6 mod 3=0). Thus, the interleaver 104 operates so that the index of every encoded bit assigned to a particular carrier frequency, when divided by the number of carrier frequencies exhibits a constant remainder.

Another characteristic is exhibited by the scheme described with reference to FIG. 3A. The "distance" between the pair of bits assigned to each bin (and therefore each carrier frequency), prior to having been re-sequenced, is three. The term "distance" refers to the difference between the positional indices of two bits. Thus, the bits $E_1$ and $E_4$ assigned to $bin_1$, have a distance of three (4−1=3). Similarly, the bits $E_2$ and $E_5$ assigned to $bin_2$ have a distance of three (5−2=3). By inspection, one can see that the same property is exhibited by the bits assigned to $bin_3$.

FIG. 3A illustrates the principle that the greatest possible distance that can be achieved for all bits within a set is equal to the number of carrier frequencies (or bins) employed by the transmitter 100. Since the exemplary transmitter 100 employs three carrier frequencies, a distance of three is exhibited by the encoded bits assigned to each bin.

If the exemplary transmitter 100 employed seven carrier frequencies, the encoded bits assigned to each bin would have a distance of seven. This is significant, because given the encoder 102 used in the example transmitter 104, encoded bits with a distance of six or less are highly correlated (this was discussed in the Background section). A transmitter 104 employing a quantity of carrier frequencies greater than the product of the constraint length and length of the code word can ensure that highly correlated bits are carried on separate carrier frequencies (and therefore on separate transmission symbols) by using the interleaving scheme described with reference to FIG. 3A. This means that distortion of a symbol does not affect highly correlated bits.

FIG. 3B presents an alternative scheme of operation of the interleaver 104. As depicted therein, the interleaver 104 may re-sequence the encoded bits $E_1$-$E_6$ by simply re-ordering the encoded bits $E_1$-$E_6$ received as inputs. If one understands FIG. 3B as presenting an interleaver 104 that receives a data structure 306 as an input, and yields a data structure 308 as an output, then the interleaver 104 may reorder the bits by re-ordering their sequence within the data structure 306. Order within the outputted data structure 308 determines the particular carrier frequency to which the encoded bits are assigned. Thus, in the present example, since two bits determine a symbol, the first two bits $E_1$ and $E_4$ in the outputted data structure 308 are assigned to the first carrier frequency and are communicated to the first modulator (modulator$_1$, in FIG. 1). Similarly, the next two bits $E_2$ and $E_5$ are assigned to the second carrier frequency and are communicated to the second modulator (modulator$_2$ in FIG. 1), and so on. As in the example described with reference to FIG. 3A, the interleaver 104 operates so as to assign encoded bits $E_1$-$E_6$ to particular modulators (modulator$_1$-modulator$_3$ in FIG. 1) on a round-robin basis. Therefore, the index of every encoded bit assigned to a particular carrier frequency, when divided by the number of carrier frequencies exhibits a constant value.

For a given set of bits, the greatest possible constant distance that can be achieved between bits assigned to the same carrier frequency is equal to the number of bins or carrier frequencies employed by the transmitter. Thus, for a system such as the exemplary system of FIG. 1, the greatest possible constant distance that can be attained from pairing to pairing is three. This principle is verified by FIGS. 4A-4C.

FIGS. 4A-4C depict each way that a set of six bits can be paired so as to create a distance of greater than three in at least one instance. As is illustrated below, each such pairing results in at least one pairing exhibiting a distance of less than three.

FIG. 4A depicts a circumstance in which a distance greater than the number of bins (i.e., a distance greater than three) is attempted to be created for one of the pairs. Specifically, encoded bits $E_1$ and $E_6$ are assigned to bin$_1$, creating a distance of five for the pair therein. However, as can be seen from FIG. 4A, such a pairing leaves the remaining unpaired bits in a circumstance in which the possible pairings for encoded bits $E_3$ and $E_4$ have a maximum distance of two. Thus, by attempting to create a distance of greater than three for one particular pairing, at least bits $E_3$ and $E_4$ must be paired in such a way that their pairing exhibits a distance less than three.

Similarly, FIG. 4B depicts another circumstance in which a distance greater than the number of bins is attempted to be created for one of the pairs. Specifically, encoded bits $E_1$ and $E_5$ are assigned to bin$_1$, creating a distance of four for the pair therein. However, as can be seen from FIG. 4B, such a pairing leaves the remaining unpaired bits in a circumstance in which the possible pairings for encoded bit $E_4$ has a maximum distance of two. Again, by attempting to create a distance of greater than three for one particular pairing, at least bit $E_4$ must be paired in such a way that their pairing exhibits a distance less than three.

Finally, FIG. 4C depicts yet another circumstance in which a distance greater than the number of bins is attempted to be created for one of the pairs. Specifically, encoded bits $E_2$ and $E_6$ are assigned to bin1, creating a distance of four for the pair therein. However, as can be seen from FIG. 4C, such a pairing leaves the remaining unpaired bits in a circumstance in which the possible pairings for encoded bit $E_3$ has a maximum distance of two. Yet again, it is observed that by attempting to create a distance of greater than three for one particular pairing, at least bit $E_3$ must be paired in such a way that their pairing exhibits a distance less than three.

In sum, by interleaving the bits according to the scheme discussed with reference to FIGS. 3A and 3B, a distance equal to the number of carrier frequencies employed by the transmitter can be attained for every bit. Other schemes may result in a greater distance being exhibited for one grouping of bits, but must necessarily result in a lesser distance being exhibited in another grouping.

Figure 5:
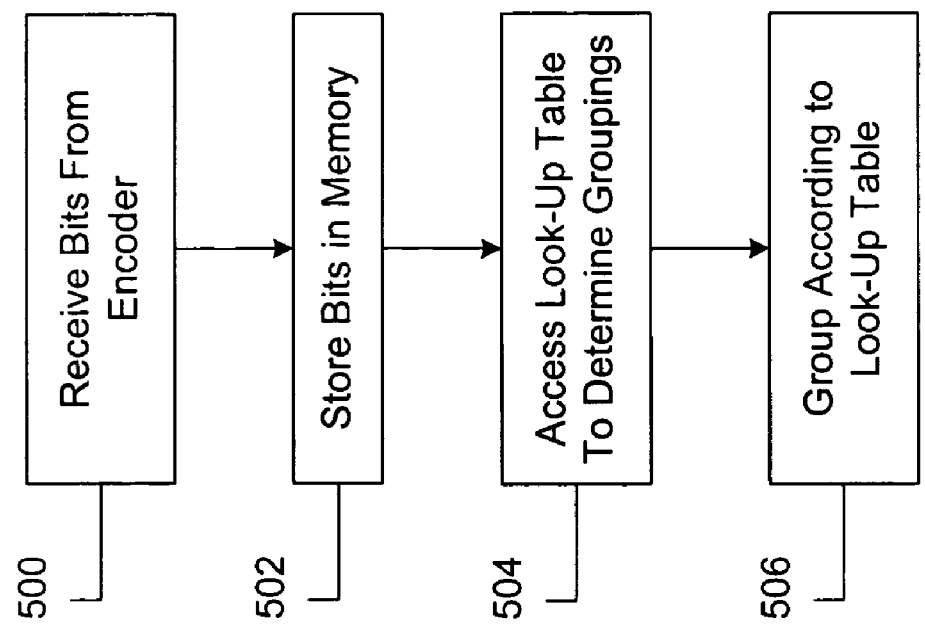
FIG. 5 depicts a scheme for implementation of the scheme presented in FIGS. 3A and 3B, according to one embodiment of the present invention.

FIG. 5 depicts one scheme by which the interleaver 104 may operate in order to achieve the re-sequencing described with reference to FIGS. 3A and 3B. As can be seen from FIG. 5, the interleaver 104 may begin operation by receiving encoded bits from the encoder, as shown in operation 500. For example, the encoded bits may be received one at a time, or may be received as an array. Thereafter, the interleaver 104 may store the bits in memory, as shown in operation 502. For example, the bits may be stored in an array in a memory space accessible by the interleaver 104. To achieve the re-sequencing described with reference to FIGS. 3A-3B, a look-up table may be accessed, as shown in operation 504. An example of such a look-up table is depicted in FIG. 6.

Figure 6:
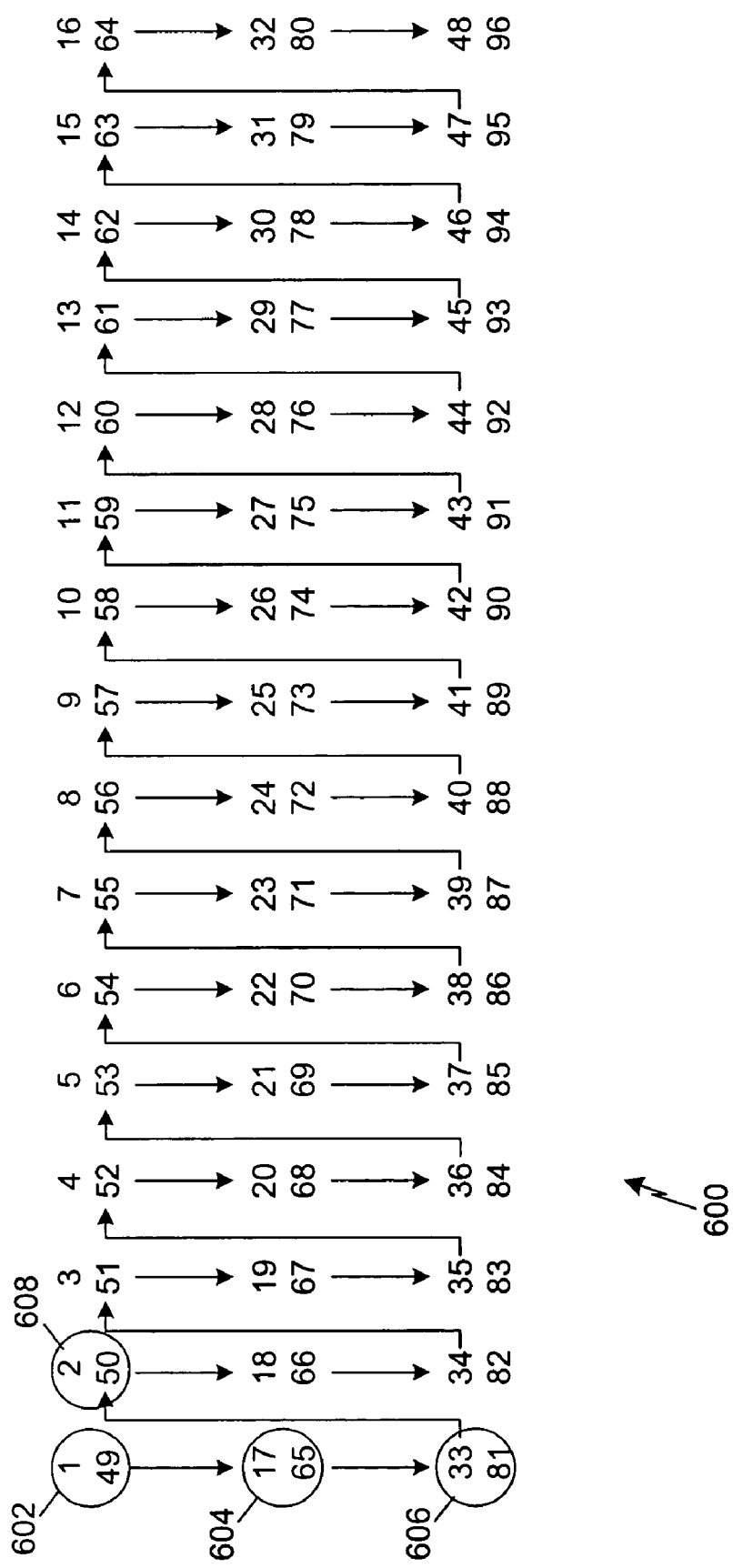
FIG. 6 depicts an example look-up table in accordance with one embodiment of the present invention.

The example look-up table 600 depicted in FIG. 6 is made up of individual groups of indices. The look-up table 600 may be used with a system employing a modulation system using forty-eight carrier frequencies, and an encoder exhibiting a constraint length and code word length, which when multiplied (nK), yields a product less than forty-eight (e.g., K=7, n=2, or K=14, n=3, etc.). For example, the first group of indices in the look-up table 600 is identified by reference numeral 602, and includes the index values 1 and 49. The index values within each group (such as group 602) refer to a location within an array in which the encoded bits have been stored. For example, index value "1" refers to the first addressable location in the array, while index value "49" refers to the forty-ninth addressable location in the array. Operation 502 (storing of the received bits in memory) may be performed so that the first encoded bit $E_1$ is stored in the first addressable location, the second encoded bit $E_2$ is stored in the second addressable location, and so on. Therefore, with reference to the first group 602, index value "1" refers to encoded bit $E_1$, while index value "49" refer to encoded bit $E_{49}$.

All of the encoded bits referred to within a particular group (such as group 602) are assigned to the same carrier frequency, and are therefore used to determine a symbol. Again with reference to the first group 602, these indices indicate that the encoded bits at the first and forty-ninth addressable locations within the array (i.e., encoded bits $E_1$ and $E_{49}$) should be assigned to the same carrier frequency.

Examination of the look-up table 600 in FIG. 6 reveals that forty-eight groups exist (some of which are identified by reference numerals 602-608), meaning that the table is used in a transmitter that utilizes forty-eight carrier frequencies. Further, since each group contains two indices, the table 600 is used in a transmitter employing a modulation technique in which two bits determine a symbol (QPSK, for example).

The look-up table 600 may be used in the following manner to assign encoded bits to carrier frequencies (operation 506 in FIG. 5). The bits referred to by the indices in the first group 602 (i.e., encoded bits $E_1$ and $E_{49}$) are assigned to the first carrier frequency. The arrows interposed between groups in FIG. 6 indicate group succession. Thus, group 604 is the second group, group 606 is the third group, group 608 is the fourth group, and so on. The bits referred to by the indices in the second group 604 (i.e., encoded bits $E_{17}$ and $E_{65}$) are assigned to the second carrier frequency. The bits referred to by the indices in the third group 606 (i.e., encoded bits $E_{33}$ and $E_{81}$) are assigned to the third carrier frequency. Similarly, the bits referred to by the indices in the fourth group 608 (i.e., encoded bits $E_2$ and $E_{50}$) are assigned to the fourth carrier frequency. As described with reference to FIGS. 3A and 3B, the process of assigning bits to a carrier frequency may be accomplished by placing the bits into "bins" which correspond to particular carrier frequencies, or by simply re-sequencing the order in which the bits are output from the interleaver 104.

It is noteworthy that the look-up table 600 exhibits the characteristics described with respect to FIGS. 3A and 3B. For example, bits within each group exhibit a distance of forty-eight—a distance that is equal to the number of carrier frequencies used by the transmitter employing the look-up table 600. Further, when divided by 48 (i.e., the number of carrier frequencies employed by the transmitter associated with the look-up table 900), the index values of bits within each group yield the same remainder.

Another quality of the look-up table 600 is noteworthy: bits identified by successive indices are not assigned to successive carrier frequencies. For example, encoded bits $E_1$ and $E_2$ are not assigned to successive carrier frequencies. Instead, encoded bit $E_1$ is assigned to the first carrier frequency, while encoded bit $E_2$ is assigned to the fourth carrier frequency. It may be desirable to ensure that successive bits are not carried on successive carrier frequencies because signal fading is oftentimes a function of carrier frequency. This means that carrier frequencies that are close in value to one another may exhibit similar fading characteristics. If successive bits were placed on successive carrier frequencies, it is possible that signal fading that affected one particular bit would affect a successive bit. This would result in highly correlated bits (successive bits are highly correlated bits, as discussed in the Background secion) being affected by signal fading—a result inimical to the goal of reliable data communication.

Embodiments of the invention may be implemented in one or a combination of hardware, firmware, and software. Embodiments of the invention may also be implemented as instructions stored on a machine-readable medium, which may be read and executed by at least one processor to perform the operations described herein. A machine-readable medium may include any mechanism for storing or transmitting information in a form readable by a machine (e.g., a computer). For example, a machine-readable medium may include read-only memory (ROM), random-access memory (RAM), magnetic disc storage media, optical storage media, flash-memory devices, electrical, optical, acoustical or other form of propagated signals (e.g., carrier waves, infrared signals, digital signals, etc.), and others.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, inventive subject matter lies in less than all features of a single disclosed embodiment. Thus, the following claims are hereby incorporated into the detailed description, with each claim standing on its own as a separate preferred embodiment.

The claimed invention is:

1. A method for encoding and interleaving data bits for OFDM transmission comprising:
    encoding a set of bits with an encoder having a constraint length that generates encoded bits having a code-word length;
    selecting, from the set of encoded bits, an encoded bit designated by an index;
    assigning the selected bit sequentially to one of N carrier frequencies that does not yet have a bit assigned thereto;
    incrementing the index, and repeating the selecting and assigning acts, until each of the N carrier frequencies has an encoded bit assigned to it; and
    for each of the N carrier frequencies, assigning another encoded bit thereto, wherein the other encoded bit is designated by an index value equal to the sum of the index of the encoded bit already assigned thereto and an integer multiple of N,
    wherein, for each of the N carrier frequencies, the bits assigned thereto at least partially jointly determine a symbol to be modulated upon the carrier frequency,
    wherein the encoded bits are assigned to each carrier frequency to provide a bit separation distance of N,
    wherein the index of any of the encoded bits assigned to a single one of the carrier frequencies, when divided by N, exhibits a constant remainder, and
    wherein N is greater than a product of the constraint length and the code word length.

2. The method of claim 1,
    further comprising:
    accessing a look-up table to determine a carrier frequency assignment based on the index of the encoded bit;
    storing encoded bits in an addressable array of memory bins associated with each of the carrier frequencies, and
    parsing, by a parser, to select encoded bits from the memory bins.

3. The method of claim 1, further comprising: determining a symbol, for each carrier frequency, based upon the bits assigned thereto.

4. The method of claim 3, further comprising: for each carrier frequency, modulating the corresponding determined symbol thereupon.

5. A device to transmit orthogonal frequency division multiplexed (OFDM) signals comprising:
    an encoder having a constraint length configured to encode a set of data bits and yield encoded bits having a code-word length;
    an interleaver in data communication with the encoder, the interleaver configured to receive and resequence the encoded bits;
    a modulation system in data communication with the interleaver, the modulation system configured to receive the resequenced encoded bits, and based thereupon, to modulate symbols upon each of a quantity of N carrier frequencies to generate an OFDM symbol;
    wherein the interleaver is adapted to:

select, from the set of encoded bits, an encoded bit designated by an index;

assign the selected bit sequentially to one of N carrier frequencies that does not yet have a bit assigned thereto;

increment the index, and repeat the selection and assignment of encoded bits until each of the N carrier frequencies has an encoded bit assigned to it;

for each of the N carrier frequencies, assign another encoded bit thereto, wherein the other encoded bit is designated by an index value equal to the sum of the index of the encoded bit already assigned thereto and an integer multiple of N;

wherein, for each of the N carrier frequencies, the bits assigned thereto at least partially jointly determine a symbol to be modulated upon the carrier frequency, wherein the encoded bits are assigned to each carrier frequency to provide a bit separation distance of N, and wherein the index of any of the encoded bits assigned to a single one of the carrier frequencies, when divided by N, exhibits a constant remainder, and wherein N is greater than a product of the constraint length and the code word length.

6. The device of claim 5, wherein each bin comprises a memory space.

7. The device of claim 5, wherein each bin corresponds to one of the N carrier frequencies.

8. The device of claim 5, wherein each bin is of a size to store two or more bits.

* * * * *